(12) United States Patent
Guo et al.

(10) Patent No.: US 10,998,885 B2
(45) Date of Patent: May 4, 2021

(54) METHOD FOR EQUIVALENT HIGH SAMPLING RATE FIR FILTERING BASED ON FPGA

(71) Applicant: University of Electronic Science and Technology of China, Sichuan (CN)

(72) Inventors: Lianping Guo, Sichuan (CN); Hao Zeng, Sichuan (CN); Feng Tan, Sichuan (CN); Duyu Qiu, Sichuan (CN); Xianggong Guo, Sichuan (CN); Yu Li, Sichuan (CN)

(73) Assignee: UNIVERSITY OF ELECTRONIC SCIENCE AND TECHNOLOGY OF CHINA, Sichuan (CN)

( * ) Notice: Subject to any disclaimer, the term of this patent is extended or adjusted under 35 U.S.C. 154(b) by 306 days.

(21) Appl. No.: 16/163,596

(22) Filed: Oct. 18, 2018

(65) Prior Publication Data
US 2019/0080035 A1    Mar. 14, 2019

(30) Foreign Application Priority Data

Oct. 26, 2017    (CN) .......................... 201711015633.X

(51) Int. Cl.
| | | |
|---|---|---|
| *H03H 17/06* | (2006.01) | |
| *H03H 17/02* | (2006.01) | |
| *H03H 17/00* | (2006.01) | |

(52) U.S. Cl.
CPC ........ *H03H 17/06* (2013.01); *H03H 17/0291* (2013.01); *H03H 2017/0081* (2013.01); *H03H 2017/0247* (2013.01)

(58) Field of Classification Search
CPC ............... H03H 17/0291; H03H 17/06; H03H 2017/0247; H03H 2017/0081
See application file for complete search history.

(56) References Cited

U.S. PATENT DOCUMENTS

| | | | | |
|---|---|---|---|---|
| 6,125,155 A | * | 9/2000 | Lesthievent | H03H 17/0685 375/349 |
| 7,480,603 B1 | * | 1/2009 | San | G06F 30/30 703/13 |
| 9,098,435 B1 | * | 8/2015 | Nelson | H03H 17/045 |

OTHER PUBLICATIONS

David A. Parker and Keshab K. Parhi, "Area-Efficient Parallel FIR Digital Filter Implementations" IEEE International Conference on Application Specification Systems 1996: p. 93-111.

(Continued)

*Primary Examiner* — Matthew D Sandifer
(74) *Attorney, Agent, or Firm* — Yue (Robert) Xu; Apex Attorneys at Law, LLP

(57) ABSTRACT

The present invention provides a method for equivalent high sampling rate FIR filtering based on FPGA, first, the coefficients h(k) of FIR filter are found by using MATLAB, multiplied by an integer and then rounded for the purpose that the rounded coefficients h(k) can be directly used into a FPGA, then the ADC's output of high data rate fs is lowered by dividing the ADC's output x(n) into M parallel data streams xi(n) of low data rate, and the M×L samples in one clock cycle is obtained by delaying the M parallel data streams xi(n) simultaneously by 1, 2, ..., L' periods of the synchronous clock, at last, the samples yi(n) of FIR filtering output is calculated according to the samples selected from the M×L samples, and the filtered data y(n) of data rate fs is obtained by putting the samples yi(n) together in ascending order of i. Thus, the continuous FIR filtering of an ADC's output sampled with high sampling rate is realized, while the data rates before and after the FIR filtering are unchanged.

2 Claims, 4 Drawing Sheets

(56) References Cited

OTHER PUBLICATIONS

Heinrich W. Lollmann and Peter Vary, "Design of Critically Subsampled DFT Filter-Banks With Allpass Polyphase Filters and Near-Perfect Reconstruction", IEEE International Conference on Acoustic, 2009 :p. 3185-3188.

Pavel Zahradnik and Miroslav Vlcek, "Perfect Decomposition Narrow-Band FIR Filter Banks", IEEE Transactions on Circuits and Systems—II: Express Briefs, vol. 59, No. 11, Nov. 2012.

* cited by examiner

METHOD FOR EQUIVALENT HIGH SAMPLING RATE FIR FILTERING BASED ON FPGA

FIELD OF THE INVENTION

This application claims priority under the Paris Convention to Chinese Patent Application No. 201711015633.X, Filed Oct. 26, 2017, the entirety of which is hereby incorporated by reference for all purposes as if fully set forth herein.

The present invention relates to the field of FIR (Finite Impulse Response) filtering, more particularly to a method for equivalent high sampling rate FIR filtering based on FPGA (Field-Programmable Gate Array), which can be applied to the FIR filtering that the highest system clock frequency of a FPGA is lower than the sampling clock frequency of an ADC (Analog-to-digital converter).

BACKGROUND OF THE INVENTION

FIR filter stands for finite impulse response filter, and is also called as non-recursive filter. FIR filter is the most basic electronic component in digital signal processing system. FIR filter has a strict linear phase-frequency characteristic under any amplitude-frequency characteristic, and its unit sample response is limited. So FIR filter is a stable system, and is widely applied to communication, image processing, pattern recognition and so on.

Before being sent to a FIR filter, a analog signal needs to be converted into a digital signal by an ADC. To avoid distortion in signal processing, the sampling rate must satisfy the Nyquist sampling theorem. Generally, the frequency of 4 to 5 times of cutoff frequency of the analog signal is taken as the sampling rate. FIR filter can be realized in FPGA or DSP (Digital Signal Processor). FPGA features regular logic array and abundant interconnects, which is particularly suitable for digital signal processing. Compared with DSP, which is serial operation-led, FPGA has a better parallelism and expandability. Therefore, by using the fast multiple-accumulating algorithm in FPGA, a high sampling rate FIR filter can be realized.

With the development of science and technology, various kinds of electronic signals exhibit the characteristic of complexity and diversity, resulting in more wider frequencies of the signals. Consequently, the more higher sampling rate is needed to digitalize the signals by ADC. The ADC with sampling rate of tens, even hundreds of GSPS is available in prior art, its output is of high data rate. However, the highest system clock frequencies of most of the high end FPGAs are lower than 1 GHz. As a result, it is impossible to directly use a FPGA to perform FIR filtering for the high data rate output of the ADC.

There are two common methods for FIR filtering for the high data rate output of the ADC.

The first method is shown in FIG. 1. The sampling rate of the ADC shown in FIG. 1 is 1 GSPS. For the reason that a FPGA can't directly process 1 GSPS data rate output of the ADC, a high-speed receiver in the FPGA is used to receive the 1 GSPS data rate output and divide it into 4 data streams of 250 MSPS data rate respectively. The 4 data streams of 250 MSPS data rate are stored in 4 FIFOs (First In First Out) respectively. Each FIFO has a storage depth of 1 K samples. When the FIFO is full, the write access to a FIFO will be stopped. Then, under the control of 250 MHz clock, the samples in the 4 FIFOs will be read out in turns and combined into one data stream of 1 GSPS data rate with the length of 4 K samples. The combined data stream of 1 GSPS data rate is performed with FIR filtering, Finally, a filtered digital data with length of 4 K samples is obtained. In the method, the combined data stream of 1 GSPS data rate is obtained by combining 4 data streams of 250 MSPS data rate. And the write accesses to the 4 FIFOs is inactive during the combination and FIR filtering, while the ADC is still in sampling, which leads to the lost of the data sampled in FIR filtering. As a result, the pipeline operation of FIR filtering cannot be implemented in FPGA.

The second method is based on polyphase filtering theory, which is shown in FIG. 2. The sampling rate of the ADC is $f_s$, i.e. the data rate of the ADC's output x(n) is $f_s$, which is higher than the highest system clock frequency of the FPGA. As shown in FIG. 2, $E_i(z)$ (i=0, 1, ..., M−1) is the polyphase branch of the prototype filter designed with sampling rate $f_s$. A high-speed receiver in the FPGA receives and divides the ADC's output x(n) into M parallel data streams $x_i(n)$ (i=0, 1, ..., M−1) of $f_s/M$ data rate, then the M parallel data streams $x_i(n)$ will be filtered by the M polyphase branch of the prototype filter respectively. After being filtered, the M parallel data streams $x_i(n)$ is combined into one data stream y(n), the data rate of which has be lowered to 1/M of the data rate of the ADC's output x(n), i.e. $f_s/M$. There is no cache in the polyphase branch of the prototype filter, so the pipeline operation of filtering can be implemented in FPGA. However, the data rate of the filtered output, i.e. data stream y(n) is different from that of the ADC's output x(n), which means that the filtering with the ADC's sampling rate cannot be equivalently realized.

When a filtering of an ADC's output is needed to be performed in pipeline, and the data rates before and after the filtering are unchanged, the two common methods for FIR filtering mentioned above cannot satisfy the requirements.

SUMMARY OF THE INVENTION

The present invention aims to overcome the deficiencies of the prior art and provides a method for equivalent high sampling rate FIR filtering based on FPGA, so as the FIR filtering of an ADC's output sampled with high sampling rate is performed continuously, i.e. in pipeline, and the data rates before and after the FIR filtering are unchanged.

To achieve these objectives, in accordance with the present invention, a method for equivalent high sampling rate FIR filtering based on FPGA is provided, comprising:

(1). using MATLAB to find the coefficients h(k) (k=0, 1, ..., L−1) of FIR filter according to the requirements of an actual application, where the length L of the FIR filter satisfies that L mod M=0, and letting L'=L/M;

(2). multiplying the coefficients h(k) by an integer, and then rounding the multiplied coefficients h(k) for the purpose that the rounded coefficients h(k) can be directly used into a FPGA;

(3). lowering the data rate $f_s$ of an ADC's output x(n) by dividing the ADC's output x(n) into M parallel data streams $x_i(n)$ (i=0, 1, ..., M−1) of $f_s/M$ data rate;

(4). delaying the M parallel data streams $x_i(n)$ simultaneously by 1, 2, ..., L' periods of the synchronous clock to obtain M×L samples in one clock cycle;

(5). selecting L+M−1 samples from the obtained M×L samples in a clock cycle, and calculating the samples $y_i(n)$ (i=0, 1, ..., M−1) of FIR filtering output as follows:

$$y_i(n) = \sum_{k=0}^{L-1} h(k)x(nM+i-k)$$

-continued $$= h(0)x(nM+i) + h(1)x(nM+i-1) + \ldots + h(L-1)x\binom{nM+}{i-(L-1)}$$

$$= h(0)x(nM+i) + h(1)x(nM+i-1) + \ldots + h(L-1)x\binom{(n-L')}{M+i+1};$$

(6). putting the samples $y_i(n)$ together in ascending order of i to obtain the filtered data y(n) of data rate $f_s$, (7). repeating the step (5), step (6) in later cycles, continuously obtaining the filtered data y(n) of data rate $f_s$.

The objectives of the present invention are realized as follows:

In the present invention i.e. a method for equivalent high sampling rate FIR filtering based on FPGA, first, the coefficients h(k) of FIR filter are found by using MATLAB, multiplied by an integer and then rounded for the purpose that the rounded coefficients h(k) can be directly used into a FPGA, then the ADC's output of high data rate $f_s$ is lowered by dividing the ADC's output x(n) into M parallel data streams $x_i(n)$ of low data rate, and the M×L samples in one clock cycle is obtained by delaying the M parallel data streams $x_i(n)$ simultaneously by 1, 2, . . . , L' periods of the synchronous clock, at last, the samples $y_i(n)$ of FIR filtering output is calculated according to the samples selected from the M×L samples, and the filtered data y(n) of data rate $f_s$ is obtained by putting the samples $y_i(n)$ together in ascending order of i. Thus, the continuous FIR filtering of an ADC's output sampled with high sampling rate is realized, while the data rates before and after the FIR filtering are unchanged.

Meanwhile, the present invention has the following advantageous features:

(1). The present invention can be applied to the FIR filtering that the highest system clock frequency of a FPGA is lower than the sampling clock frequency of an ADC;

(2). The operation of FIR filtering of an ADC's output sampled with high sampling rate can be performed continuously, i.e. in pipeline in a FPGA;

(3). The data rates before and after the FIR filtering are unchanged, an ADC's output sampled with high sampling rate is always filtered at the high sampling rate.

BRIEF DESCRIPTION OF THE DRAWING

The above and other objectives, features and advantages of the present invention will be more apparent from the following detailed description taken in conjunction with the accompanying drawings, in which.

DETAILED DESCRIPTION OF THE PREFERRED EMBODIMENT

Figure 1:
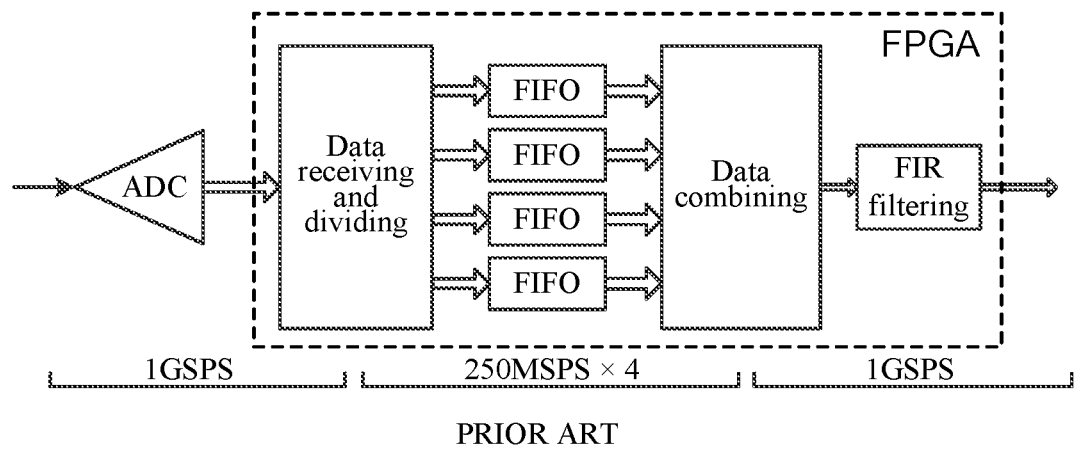
FIG. 1 is a diagram of a FIR filtering structure based on the combination of multi-channel parallel data in prior art.
Figure 2:
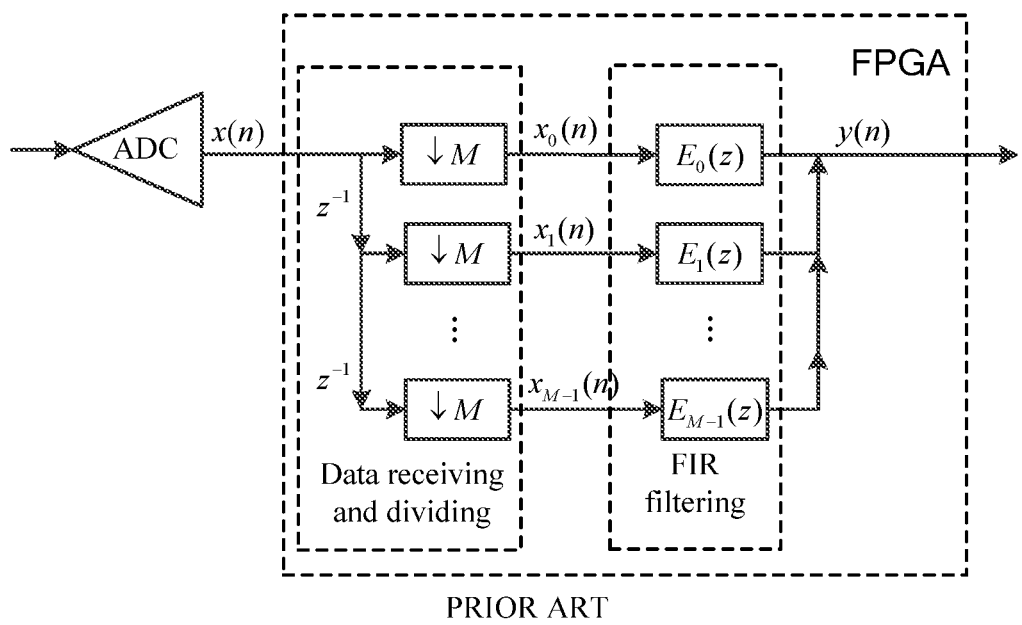
FIG. 2 is a diagram of a polyphase filtering structure in prior art.

Hereinafter, preferred embodiments of the present invention will be described with reference to the accompanying drawings. It should be noted that the similar modules are designated by similar reference numerals although they are illustrated in different drawings. Also, in the following description, a detailed description of known functions and configurations incorporated herein will be omitted when it may obscure the subject matter of the present invention.

Embodiment

Figure 3:
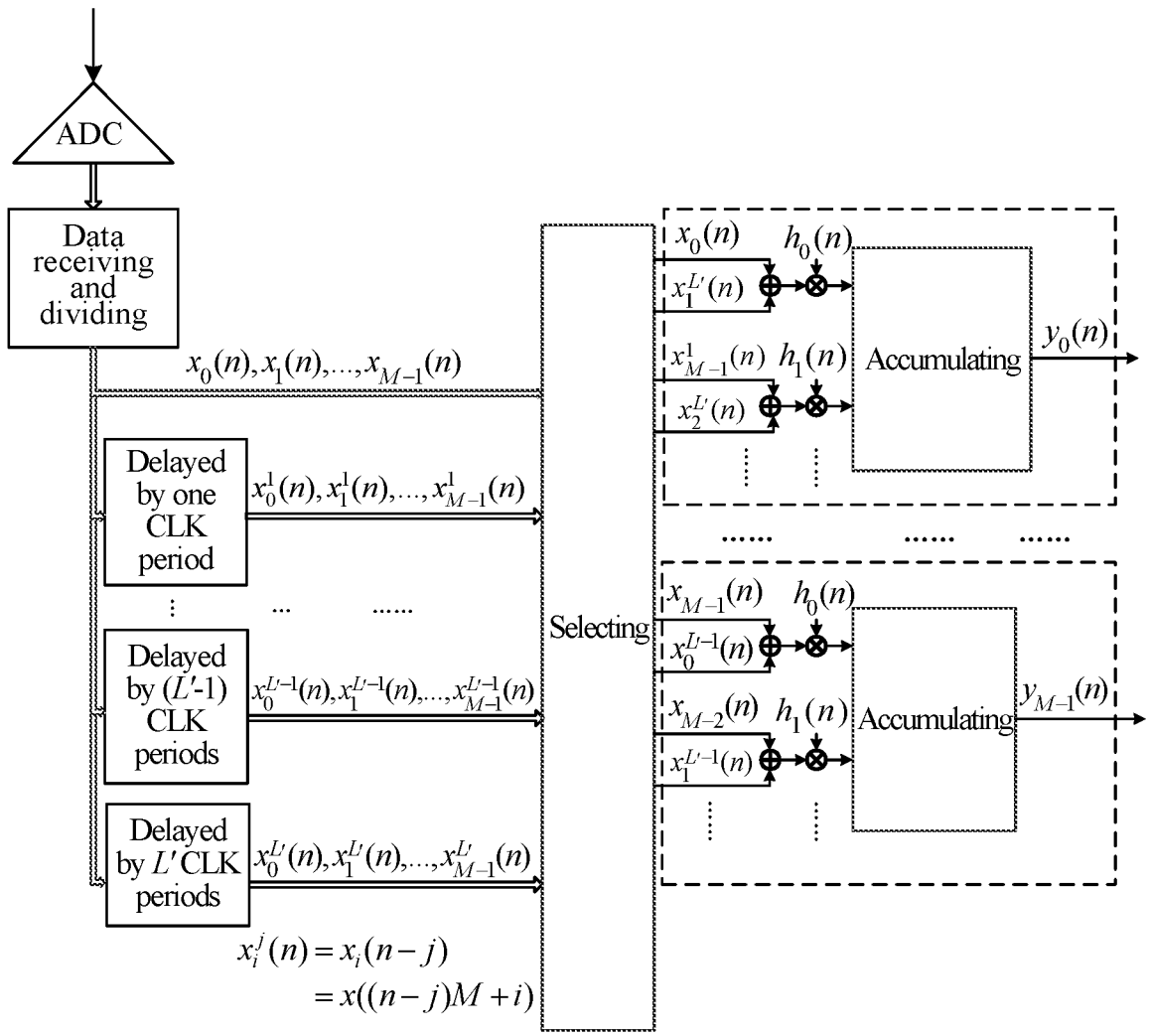
FIG. 3 is a diagram of a FIR filtering structure in accordance with the present invention.

FIG. 3 is a diagram of a FIR filtering structure in accordance with the present invention.

In one embodiment, the data rate of an ADC's output x(n) is $f_s$, i.e. the ADC's output x(n) is obtained at sampling rate $f_s$. The impulse response, namely the coefficients of FIR filter are h(k), k=1, 2, . . . , L−1. The filtered data of the ADC's output x(n) is y(n). The data rate of the filtered data y(n) is same as that of the ADC's output x(n), also is $f_s$. The filtered data y(n) is:

$$y(n) = \sum_{k=-\infty}^{\infty} h(k)x(n-k) \quad (1)$$

Where the clock frequency of filtering operation is $f_s$. While the filtering operation is realized in a FPGA, the ADC's output x(n) cannot directly be received by the FPGA because the clock frequency $f_s$ of filtering operation is higher than the highest system clock frequency of the FPGA. Thus, the data rate $f_s$ of the ADC's output x(n) is needed to be lowered by using a high-speed receiver to divide it into M parallel data streams $x_i(n)$. So the equation (1) is performed in parallel, and multi channels (M) filtered data $y_i(n)$, i=1, 2, . . . M−1, are outputted. The multi channels filtered data are the polyphase decompositions of the filtered data y(n), and the data rate of the filtered data y(n) is same as that of the ADC's output x(n). Therefore, the essence of the present invention is: by using the multi channels of parallel filtering to realize that the data rate before and after the FIR filtering is unchanged.

Figure 4:
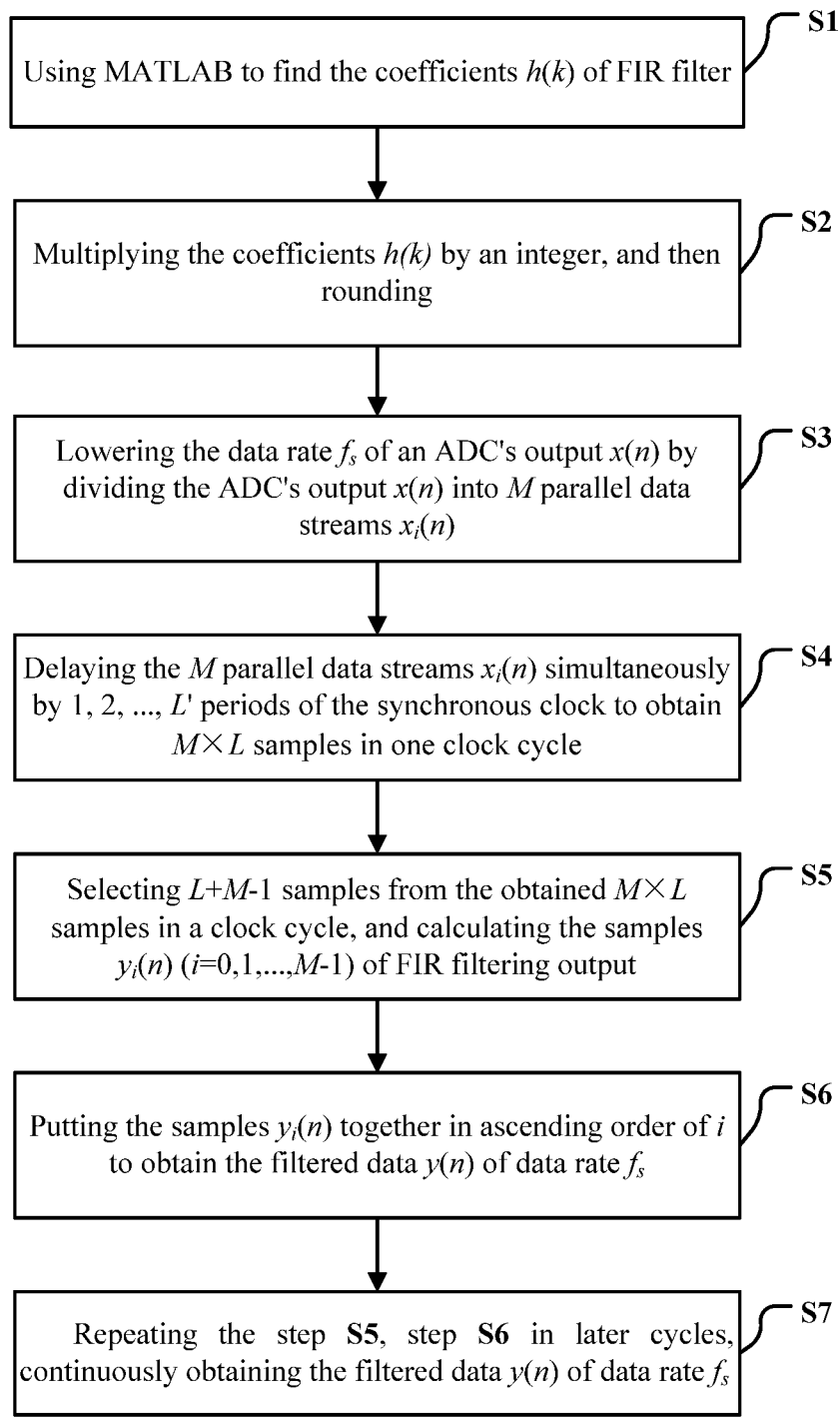
FIG. 4 is a flow diagram of an equivalent high sampling rate FIR filtering based on FPGA in accordance with the present invention.

FIG. 4 is a flow diagram of an equivalent high sampling rate FIR filtering based on FPGA in accordance with the present invention.

In one embodiment, As shown in FIG. 3 and FIG. 4, a method for equivalent high sampling rate FIR filtering based on FPGA comprises the following steps:

Step S1: Using MATLAB to find the coefficients h(k) of FIR filter according to the requirements of an actual application, where the length L of the FIR filter satisfies that L mod M=0, and letting L'=L/M.

Step S2: Multiplying the coefficients h(k) by an integer, and then rounding the multiplied coefficients h(k) for the purpose that the rounded coefficients h(k) can be directly used into a FPGA.

In the embodiment, the integer is selected as the integral power of 2.

Step S3: Lowering the data rate $f_s$ of an ADC's output x(n) by dividing the ADC's output x(n) into M parallel data streams $x_i(n)$ (i=0, 1, . . . , M−1) of $f_s$/M data rate.

In the embodiment, the high-speed receiver divides the ADC's output x(n) into M parallel data streams $x_i(n)$ of $f_s$/M data rate, the filtered data y(n) are decomposed into $y_i(n)$ (i=0, 1, . . . , M−1), They can be expressed in equation as:

$$\begin{cases} x_i(n) = x(nM+i) \\ y_i(n) = y(nM+i) \end{cases} \quad (2)$$

Step S4: Delaying the M parallel data streams $x_i(n)$ simultaneously by 1, 2, ..., L' periods of the synchronous clock to obtain M×L samples in one clock cycle.

When the length of the FIR filter is L, and L mod M=0, the samples $y_i(n)$ (i=0, 1, ..., M−1) of FIR filtering output is:

$$y_i(n) = y(nM + i) \quad (3)$$

$$= \sum_{k=0}^{L-1} h(k)x(nM + i - k)$$

Further:

$$y_i(n) = \sum_{k=0}^{L-1} h(k)x(nM + i - k) \quad (4)$$

$$= h(0)x(nM + i) + h(1)x(nM + i - 1) + \ldots + h(L-1)x\begin{pmatrix} nM + \\ i - (L-1) \end{pmatrix}$$

$$= h(0)x(nM + i) + h(1)x(nM + i - 1) + \ldots + h(L-1)x\begin{pmatrix} (n - L') \\ M + i + 1 \end{pmatrix}$$

From equation (4), to obtain one sample $y_i(n)$, i+1+(L'−1)M+M−i−1=L'M=L continuous samples of x(n) are needed to implement the multiple-accumulating in equation (4). And if M continuous samples of filtered data y(n), which respectively respond to the samples $y_i(n)$ (i=0, 1, ..., M−1), are needed to be obtained simultaneously in one clock cycle, the L+M−1 continuous samples from x((n−L')M+1) to x((nM+M−1) are needed.

Figure 5:
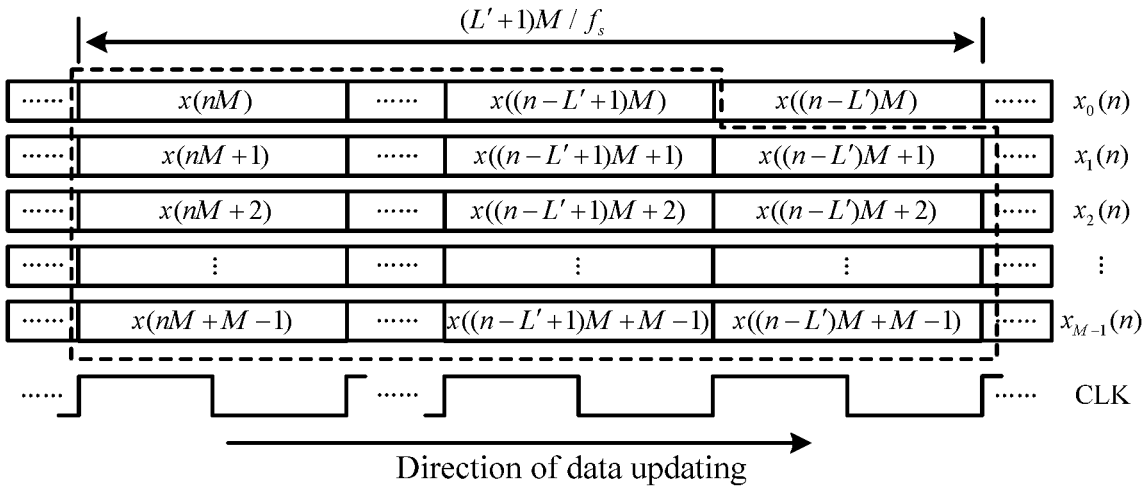
FIG. 5 is a diagram of locations of the L+M−1 continuous samples of an ADC's output x(n) in L'+1 continuous clock cycles of CLK in accordance with the present invention.

The locations of the L+M−1 continuous samples are shown in FIG. 5, where CLK is the synchronous clock of frequency $f_s/M$. From the FIG. 5, we will find that the L+M−1 continuous samples are distributed in L'+1 continuous clock cycles of CLK.

Figure 6:
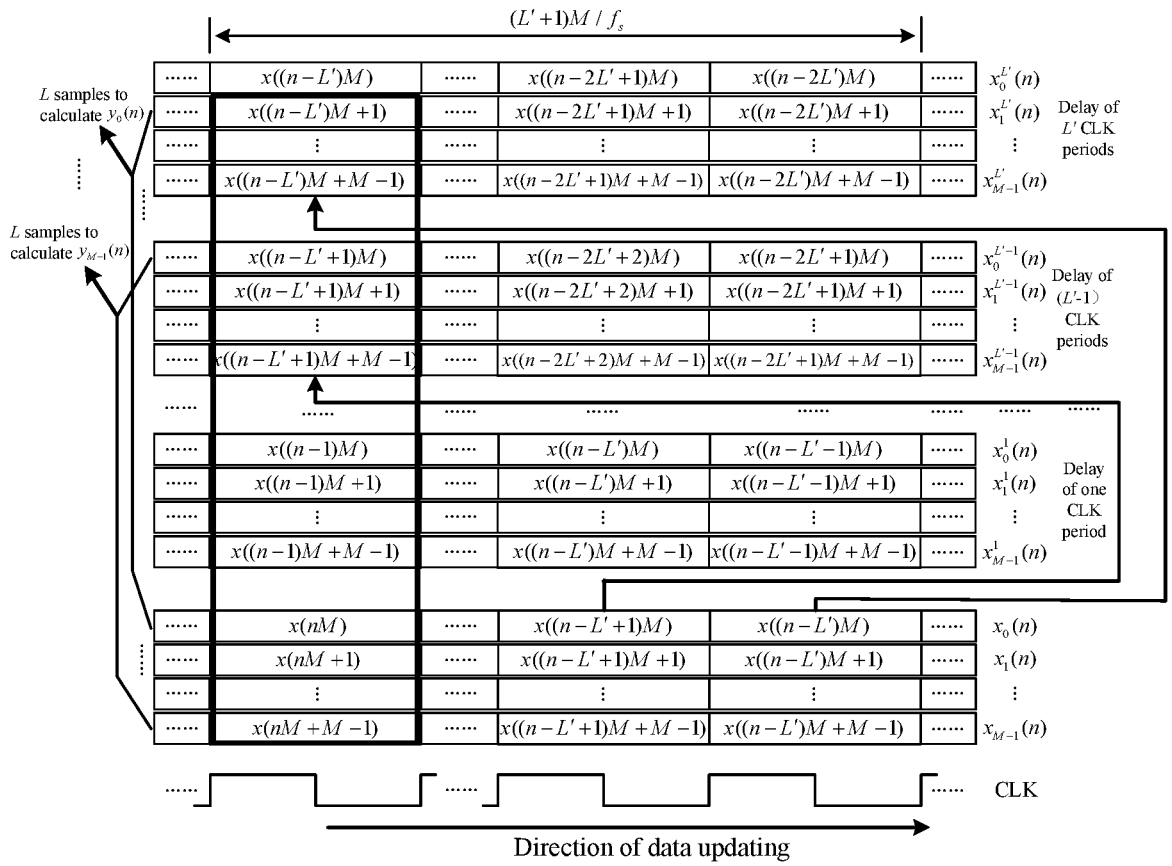
FIG. 6 is a diagram of locations of the L+M−1 continuous samples of an ADC's output x(n) in one cycle of CLK in accordance with the present invention.

As shown in FIG. 6, to obtain the L+M−1 continuous samples in one clock cycle, the M parallel data streams $x_i(n)$ are delayed simultaneously by 1, 2, ..., L' periods of the synchronous clock, where $x_i^j(n)$ is the sample obtained by delaying $x_i(n)$ j periods of CLK and can be express as follows:

$$x_i^j(n) = x_i(n - j) \quad (5)$$

$$= x((n - j)M + i)$$

where j=1, 2, ..., L'.

After delaying the M parallel data streams $x_i(n)$, the M×L samples in one clock cycle (for example, the leftmost column) are obtained in one clock cycle. The L+M−1 continuous samples from x((n−L')M+1) to x((nM+M−1) are in the M×L samples.

In the embodiment, datain_i denotes $x_i(n)$ and datain_i_j is obtained by delaying datain_i_j periods of CLK. The related Verilog codes in FPGA are as follows:

```
always @ (posedge CLK)
  begin
    datain_0_1   <=   datain _0;
    datain_0_2   <=   datain_0_1;
    ...
    datain_0_j   <=   datain_0_(j-1);
    ...
    datain_0_L'  <=   datain_0_(L'-1);   //i=0
    ----------------------------------------------------------
    datain_1_1   <=   datain _1;
    datain_1_2   <=   datain_1_1;
    ...
    datain_1_j   <=   datain_1_(j-1);
    ...
    datain_1_L'  <=   datain_1_(L'-1);   // i=1
    ----------------------------------------------------------
    ...............
    ----------------------------------------------------------
    datain_(M-1)_1  <=   datain _(M-1);
    datain_(M-1)_2  <=   datain_(M-1)_1;
    ...
    datain_(M-1)_j  <=   datain_(M-1)_(j-1);
    ...
    datain_(M-1)_L' <=   datain_(M-1)_(L'-1);   //i=M-1
  end
```

After executing the above codes, the M×L samples in one clock cycle are obtained.

Step S5: Selecting L+M−1 samples from the obtained M×L samples in a clock cycle, and calculating the samples $y_i(n)$ (i=0, 1, ..., M−1) of FIR filtering output as follows:

$$y_i(n) = \sum_{k=0}^{L-1} h(k)x(nM + i - k) \quad (6)$$

$$= h(0)x(nM + i) + h(1)x(nM + i - 1) + \ldots + h(L-1)x\begin{pmatrix} nM + \\ i - (L-1) \end{pmatrix}$$

$$= h(0)x(nM + i) + h(1)x(nM + i - 1) + \ldots + h(L-1)x\begin{pmatrix} (n - L') \\ M + i + 1 \end{pmatrix}$$

In the embodiment, dataout_i denotes $y_i(n)$, and coeff_n denotes the coefficients h(k) (k=0, 1, ..., L−1). The related Verilog codes are as follows:

```
always @(posedge CLK)
  begin
    data_out_0 <= coeff_0*datain_0 + coeff_1*datain_(M-1)_1 + ... +
    coeff_(L-1)*datain_1_L';
// i=0
    data_out_1 <= coeff_0*datain_1 + coeff_1*datain_0 + ... +
    coeff_(L-1)*datain_2_L';   //
i=1
    .....................
    data_out_(M-1) <= coeff_0*datain_(M-1) + coeff_1*datain_(M-2) + ... +
    coeff_(L-1)*datain_0_(L'-1);   //i=M-1
  end
```

After executing the above codes, the samples $y_i(n)$ (i=0, 1, . . . , M−1) of FIR filtering output are obtained.

Step S6: Putting the samples $y_i(n)$ together in ascending order of i to obtain a filtered data y(n) of data rate $f_s$.

Step S7: Repeating the step S5, step S6 in later cycles, continuously obtaining the filtered data y(n) of data rate $f_s$.

Thus, the continuous FIR filtering of an ADC's output sampled with high sampling rate is realized, while the data rates before and after the FIR filtering are unchanged.

In present invention, according to equation (4), the calculation of each sample $y_i(n)$ needs all L filter coefficients, but different samples of the ADC's output x(n) are involved. For the calculation of one sample $y_i(n)$, L multipliers are needed. Thus, for the calculation of all samples $y_i(n)$ (i=0, 1, . . . , M−1), M× L multipliers are needed. In actual application, the coefficients of FIR filter are symmetric, i.e. h(k)=h(L−1−k), k=0, 1, . . . , L−1, only half of the M× L multipliers are needed, saving half of multiplier sources.

While illustrative embodiments of the invention have been described above, it is, of course, understand that various modifications will be apparent to those of ordinary skill in the art. Such modifications are within the spirit and scope of the invention, which is limited and defined only by the appended claims

What is claimed is:

1. A method for equivalent high sampling rate FIR filtering based on FPGA, comprising:
   (1). finding the coefficients h(k) of FIR filter according to the requirements of an actual application, where the length L of the FIR filter satisfies that L mod M=0, and letting L'=L/M;
   (2). multiplying the coefficients h(k) by an integer, and then rounding the multiplied coefficients h(k) for the purpose that the rounded coefficients h(k) can be directly used into a FPGA;
   (3). using a divider in the FPGA to lower the data rate $f_s$ of an ADC's output x(n) by dividing the ADC's output x(n) into M parallel data streams $x_i(n)$ (i=0, 1, . . . , M−1) of $f_s/M$ data rate;
   (4). using M delay elements in the FPGA to respectively delay the M parallel data streams $x_i(n)$ simultaneously by 1, 2, . . . , L' synchronous clock periods to obtain M×L samples in one clock cycle;
   (5). using a selecting circuit in the FPGA to select L+M−1 samples from the obtained M×L samples in a clock cycle, and using the rounded coefficients h(k) by multipliers and adders in the FPGA to calculate the samples $y_i(n)$ (i=0, 1, . . . , M−1) of FIR filtering output as follows:

$$y_i(n) = \sum_{k=0}^{L-1} h(k)x(nM + i - k)$$
$$= h(0)x(nM+i) + h(1)x(nM+i-1) + \ldots + h(L-1)x\binom{nM+i-}{(L-1)}$$
$$= h(0)x(nM+i) + h(1)x(nM+i-1) + \ldots + h(L-1)x\binom{(n-L')}{M+i+1};$$

(6). putting the samples $y_i(n)$ together in ascending order of i to obtain the filtered data y(n) of data rate $f_s$;
   (7). repeating the step (5), step (6) in later cycles, continuously obtaining the filtered data y(n) of data rate $f_s$.

2. The method for equivalent high sampling rate FIR filtering based on FPGA of claim 1, wherein the integer is the integral power of 2.

* * * * *